US009559283B2

(12) United States Patent
Gambino et al.

(10) Patent No.: US 9,559,283 B2
(45) Date of Patent: Jan. 31, 2017

(54) INTEGRATED CIRCUIT COOLING USING EMBEDDED PELTIER MICRO-VIAS IN SUBSTRATE

(71) Applicant: International Business Machines Corporation, Armonk, NY (US)

(72) Inventors: Jeffrey P. Gambino, Portland, OR (US); Richard S. Graf, Gray, ME (US); Sudeep Mandal, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/672,272

(22) Filed: Mar. 30, 2015

(65) Prior Publication Data

US 2016/0293822 A1  Oct. 6, 2016

(51) Int. Cl.
*H01L 35/30* (2006.01)
*H01L 35/32* (2006.01)
*H01L 35/34* (2006.01)

(52) U.S. Cl.
CPC ............... *H01L 35/32* (2013.01); *H01L 35/34* (2013.01)

(58) Field of Classification Search
CPC .......... H01L 35/00; H01L 35/30; H01L 27/16; H01L 27/14601
See application file for complete search history.

(56) References Cited

U.S. PATENT DOCUMENTS

| 5,032,897 | A | 7/1991 | Mansuria et al. |
| 6,043,982 | A | 3/2000 | Meissner |
| 6,094,919 | A | 8/2000 | Bhatia |
| 6,121,539 | A | 9/2000 | Johnson et al. |
| 6,262,357 | B1 | 7/2001 | Johnson et al. |
| 6,645,786 | B2 | 11/2003 | Pomerene et al. |
| 6,727,422 | B2 | 4/2004 | Macris |
| 7,250,327 | B2 | 7/2007 | Sakamoto |

(Continued)

FOREIGN PATENT DOCUMENTS

| CN | 103794581 A | 5/2014 |
| WO | 2012025025 A1 | 3/2012 |

OTHER PUBLICATIONS

IBM: List of IBM Patents or Patent Applications Treated as Related (Appendix P), Sep. 11, 2015, pp. 1-2.

(Continued)

*Primary Examiner* — Seahvosh Nikmanesh
(74) *Attorney, Agent, or Firm* — Michael A. Petrocelli

(57) ABSTRACT

A semiconductor device package and method for manufacturing the same, includes a semiconductor substrate including a plurality of embedded thermoelectric couples. The embedded thermoelectric couples can be in trenches and extend partially into the substrate from the handle side of the substrate. An n-type pillar and a p-type pillar are electrically connected using a conducting contact plate to form each of the partially embedded thermoelectric couples. A series connection layer electrically connects the plurality of thermoelectric couples on the handle side. A power source provides electrical current to the series connection layer allowing current to flow through the plurality of the series connected thermoelectric couples. A heat sink is positioned adjacent to the connected thermoelectric couples for transferring heat away from the device side to the heat sink using the thermoelectric couples.

10 Claims, 12 Drawing Sheets

(56) References Cited

U.S. PATENT DOCUMENTS

| | | |
|---|---|---|
| 7,893,529 B2 | 2/2011 | Hsu et al. |
| 8,319,331 B2 | 11/2012 | Ibaraki |
| 8,441,092 B2 | 5/2013 | Shankar et al. |
| 8,598,700 B2 | 12/2013 | Gu et al. |
| 2005/0178423 A1 | 8/2005 | Ramanathan et al. |
| 2006/0000502 A1* | 1/2006 | Fiorini .................... H01L 35/34 136/224 |
| 2006/0168969 A1 | 8/2006 | Mei et al. |
| 2014/0261608 A1 | 9/2014 | Wang |

OTHER PUBLICATIONS

Pending U.S. Appl. No. 14/850,993, filed Sep. 11, 2015, entitled: "Integrated Circuit Cooling Using Embedded Peltier Micro-Vias in Substrate", pp. 1-31.

* cited by examiner

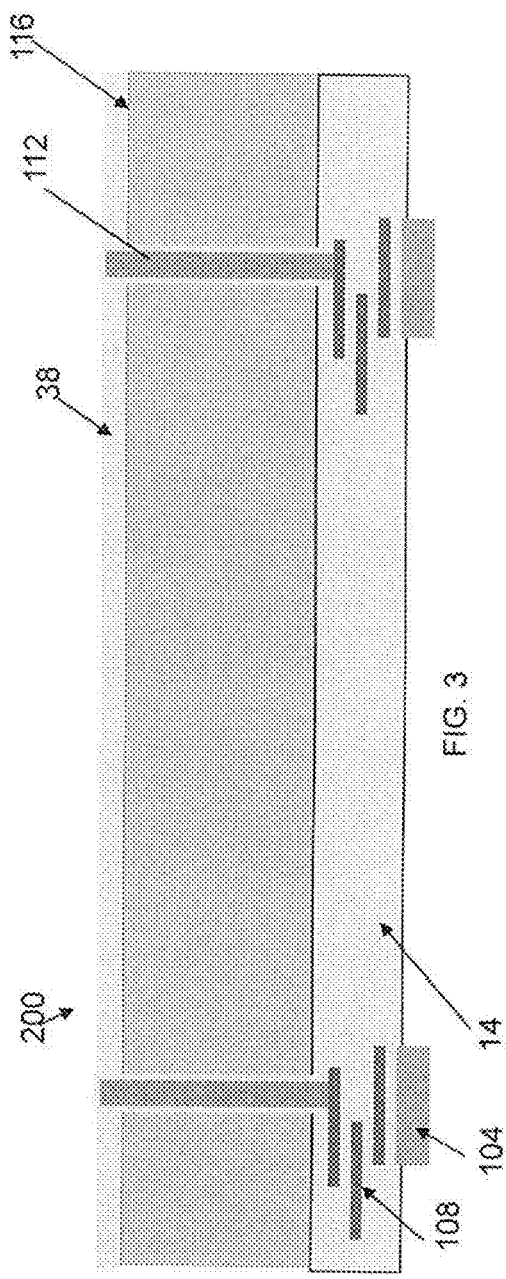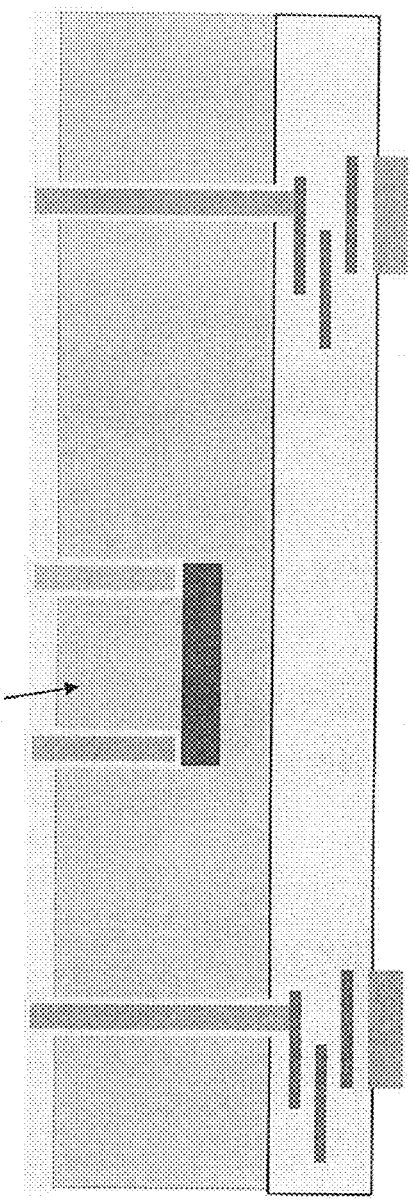

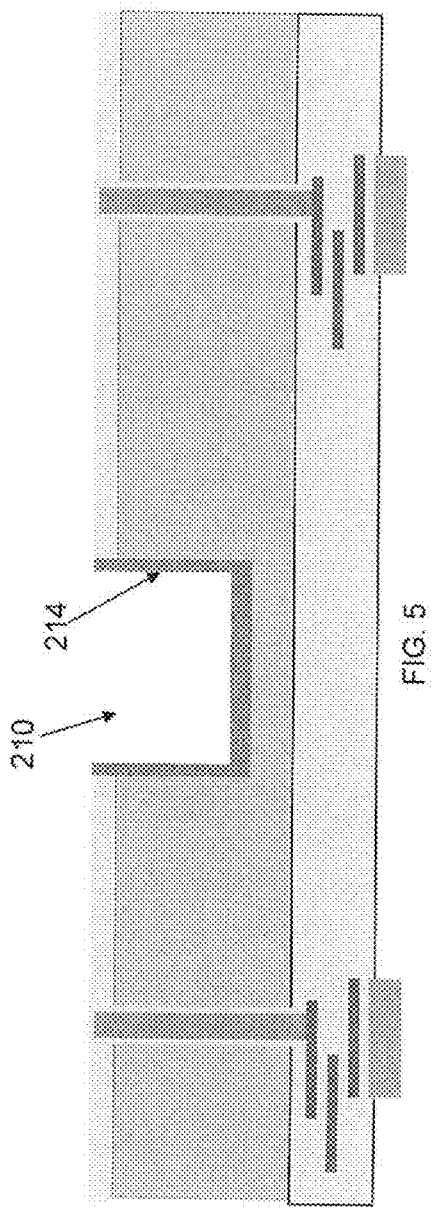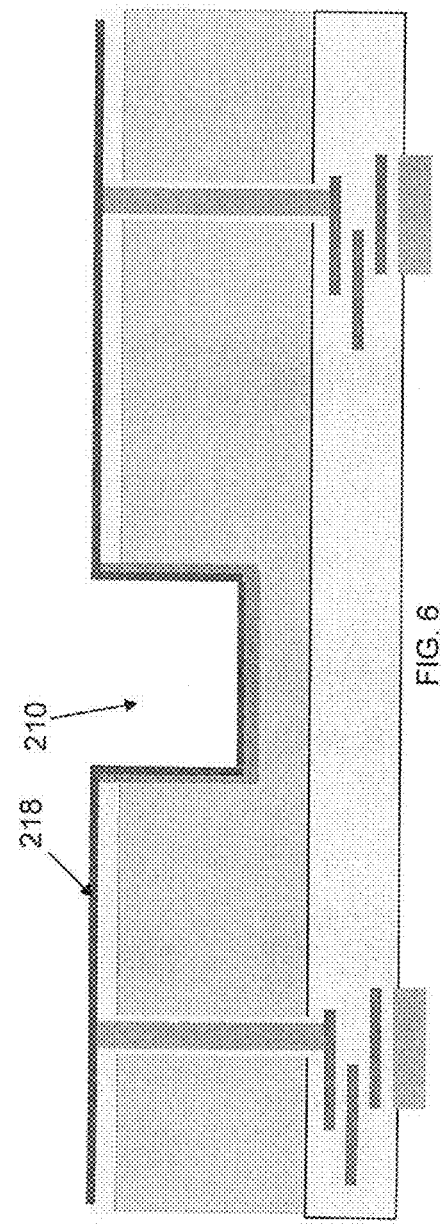

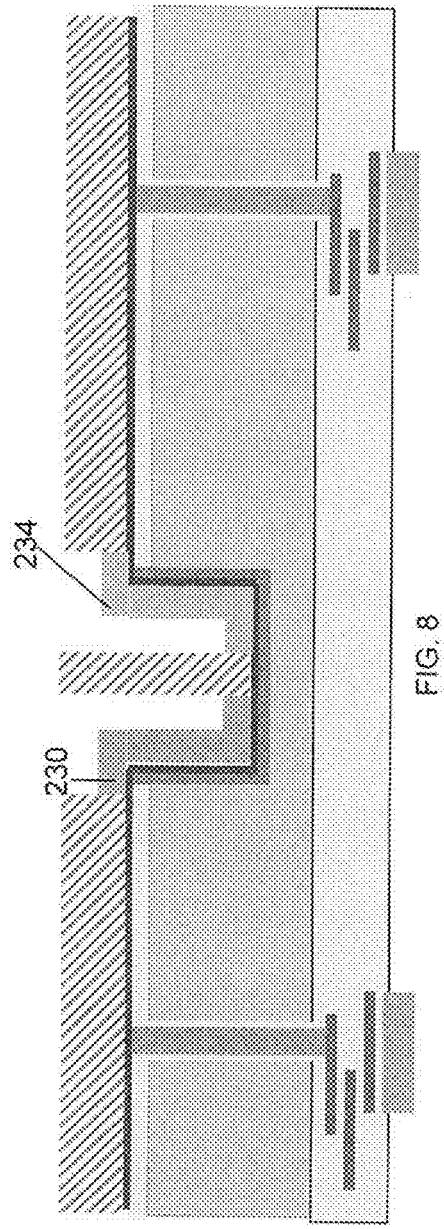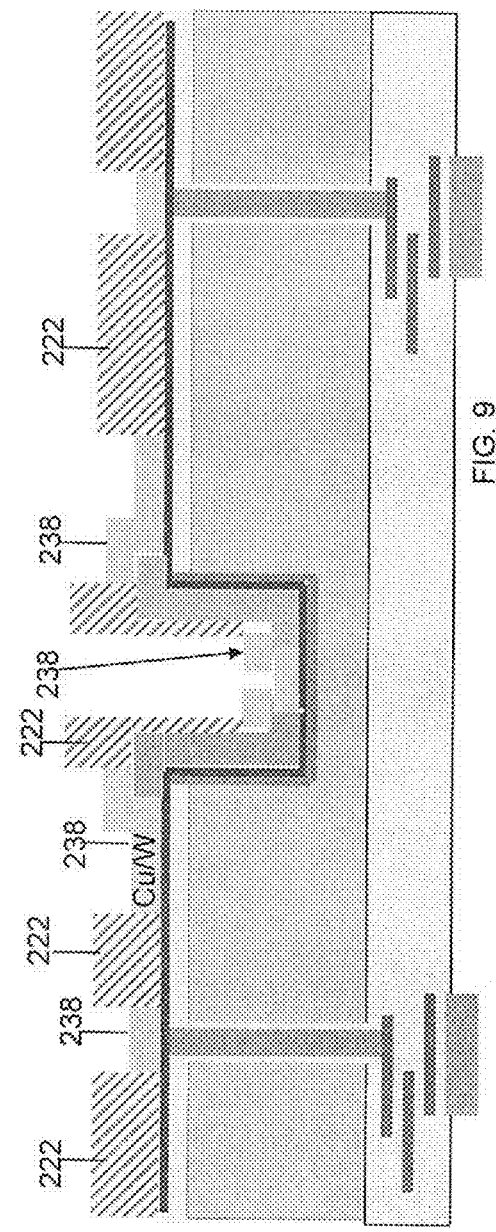

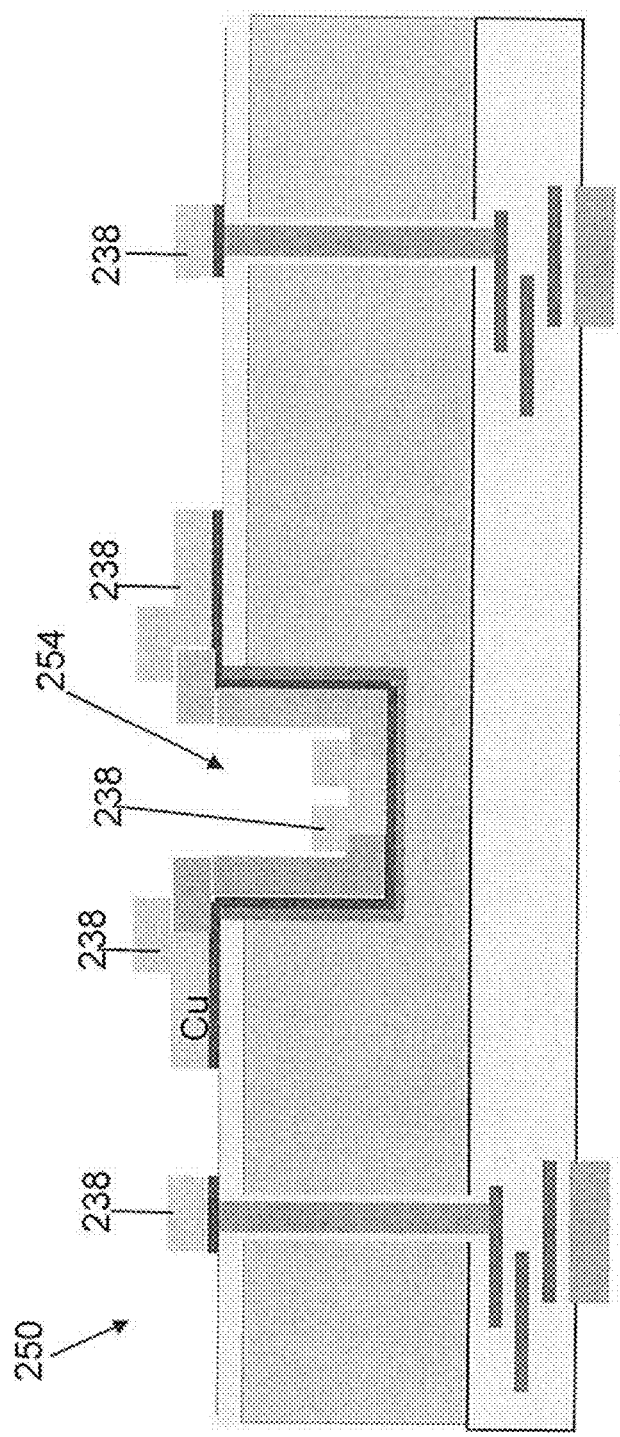

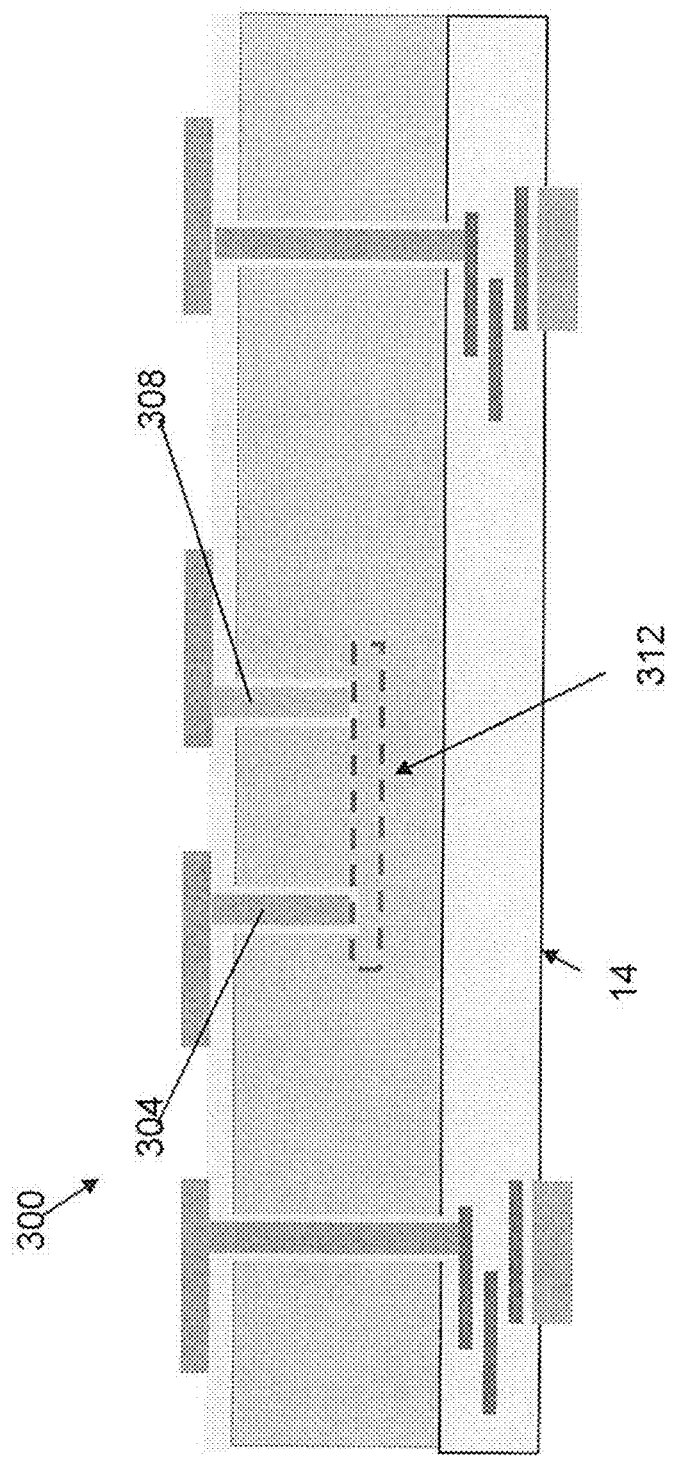

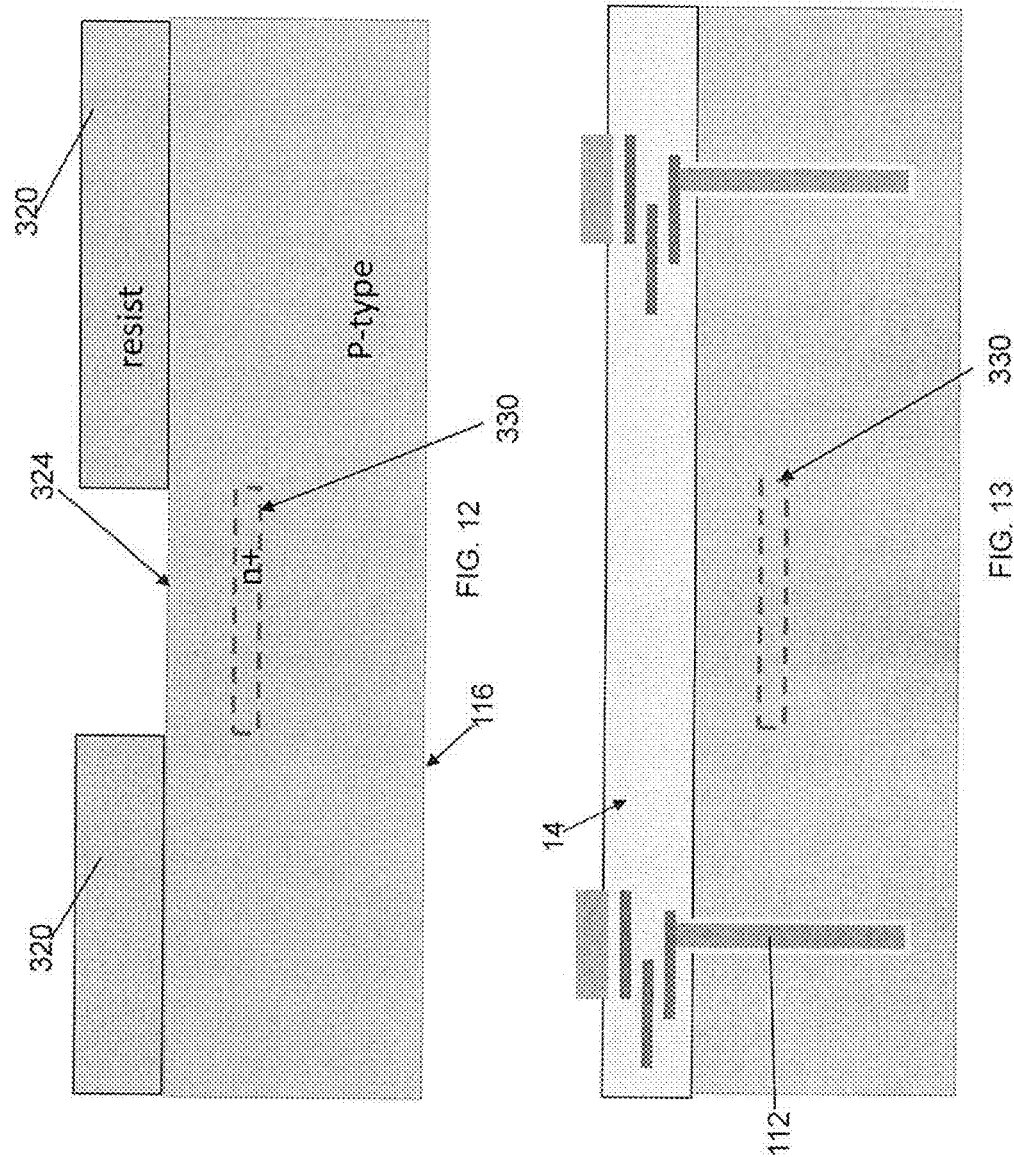

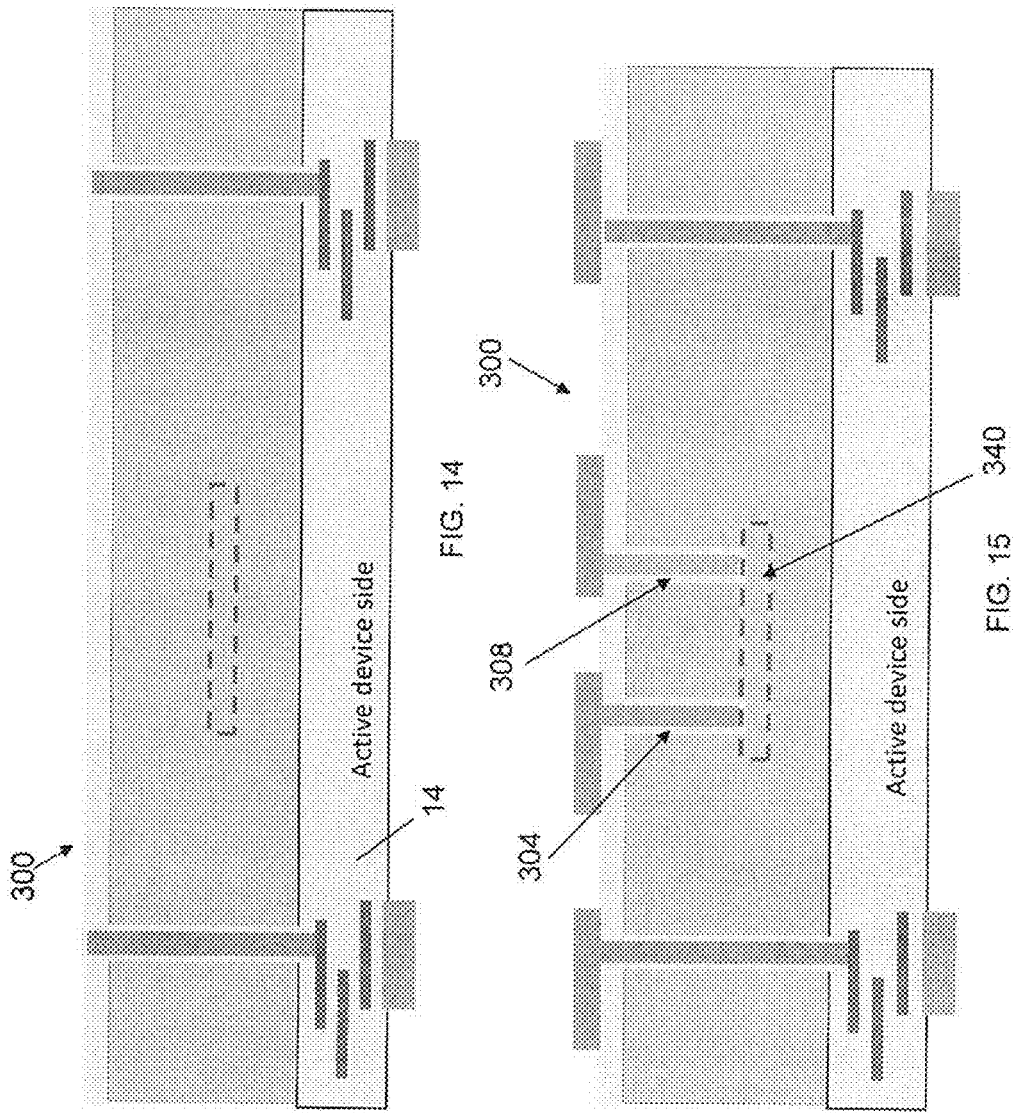

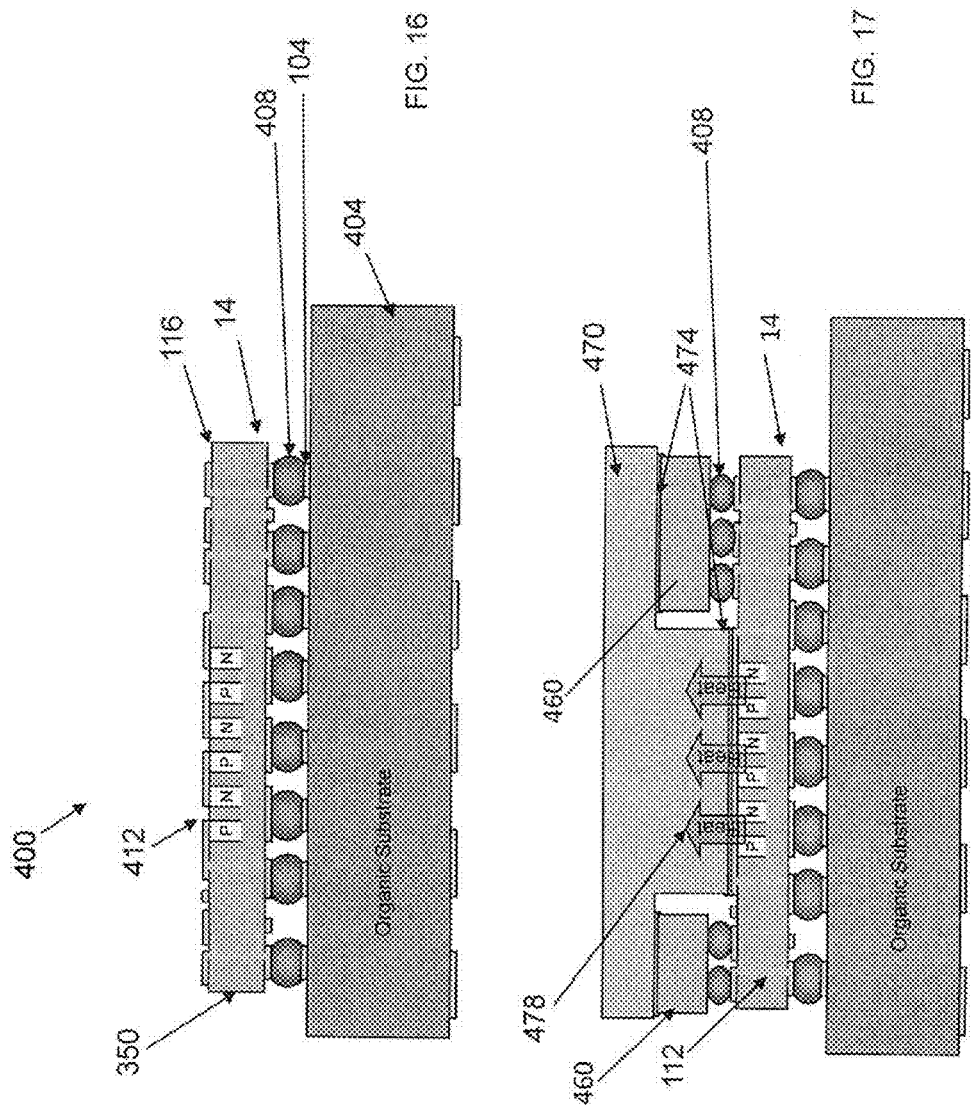

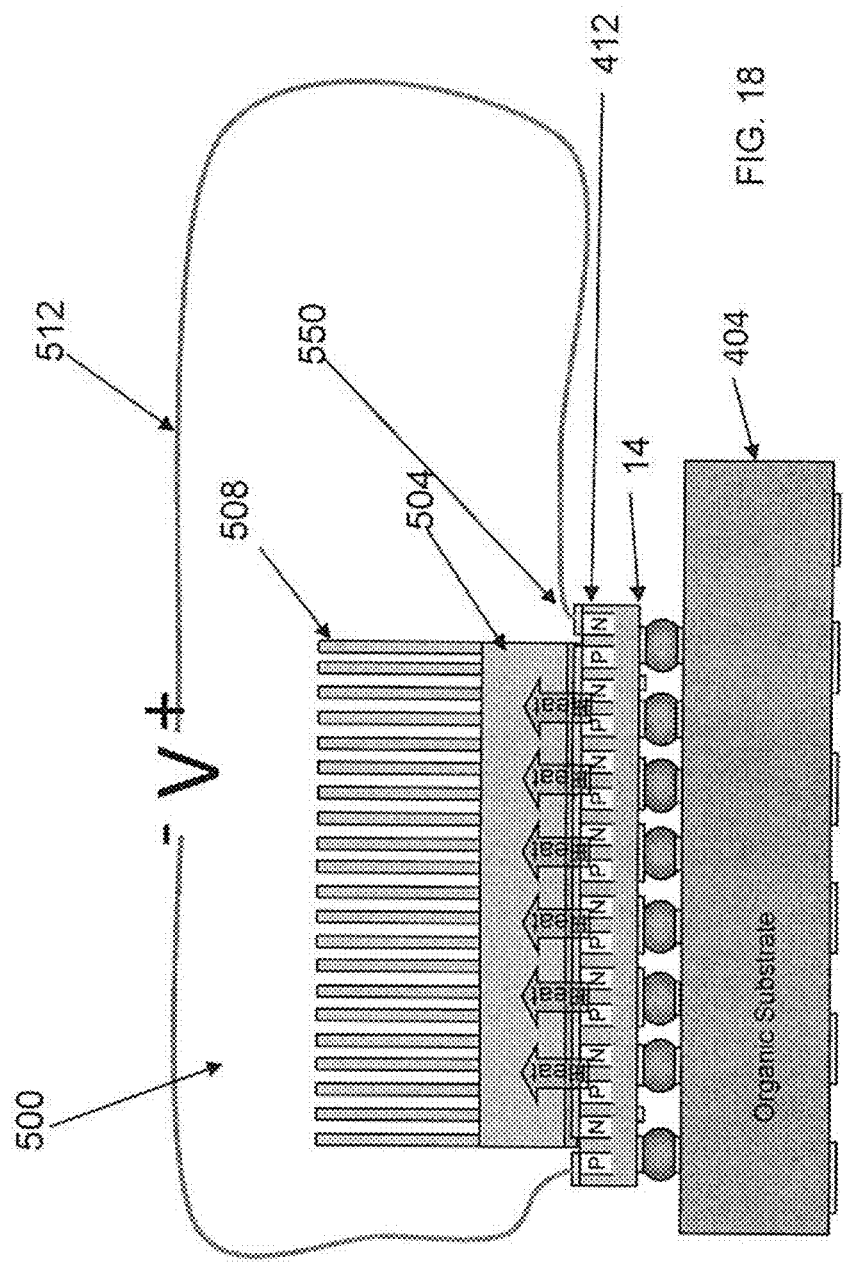

US 9,559,283 B2

INTEGRATED CIRCUIT COOLING USING EMBEDDED PELTIER MICRO-VIAS IN SUBSTRATE

BACKGROUND

The present disclosure relates to a semiconductor structure and method for semiconductor fabrication. Integrated circuits (IC(s)) can generate heat in a semiconductor package. Heat within the semiconductor package can cause undesirable consequences in the semiconductor package, such as a deleterious impact on the functioning of devices within the IC, and failure of components. Cooling techniques for the IC can include a heat sink or other cooling mechanisms requiring power from the IC and the semiconductor package. Three dimensional integrated circuits are particularly prone to undesirable heat buildup within the device or package.

SUMMARY

According to an embodiment of the invention, a semiconductor device package includes a plurality of thermoelectric couples embedded in a semiconductor substrate. The thermoelectric couples each include thermoelectric pillars positioned opposite one another in each of a plurality of trenches in the substrate. Each of the trenches define an opening in a handle side of the substrate which is opposite from a device side of the substrate. The pillars extend partially into the substrate from the handle side of the substrate, and the opposing pillars are N type and P type materials, respectively. A thermally conducting isolation layer is along a perimeter of the trenches and along outer sides of the pillars. A conductive plate electrically connects the n type and p type pillars. A series connection layer electrically connects the plurality of thermoelectric couples on the handle side of the substrate for receiving a voltage via the series connection layer. A heat sink is positioned adjacent to the thermoelectric couples for transferring heat away from the device side of the substrate to the heat sink using the thermoelectric couples.

According to another embodiment of the invention, a method for manufacturing a semiconductor substrate includes forming trenches extending partially into a substrate from a handle side of the substrate which is opposite from a device side of the substrate. The trenches define an opening in the handle side of the substrate for each of the trenches. A thermally conducting isolation layer is deposited along a perimeter of the trenches and is positioned along outer sides of the pillars. N-type pillars and p-type pillars are formed opposite one another and on opposite sides of each of the trenches to form thermoelectric couples. A conductive plate is formed for electrically connecting the N-type and the P-type pillars. A series connection layer is formed which electrically connects the plurality of thermoelectric couples for receiving a voltage via the series connection layer. A heat sink is positioned adjacent to the thermoelectric couples to transfer heat away from the device side of the substrate to the heat sink using the thermoelectric couples.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings:

FIG. 3 is a cross sectional side elevation view of a substrate having a device level/layer and through silicon vias, according to an embodiment of the disclosure;

FIG. 4 is a cross sectional side elevation view of the substrate shown in FIG. 3, having a trench;

FIG. 5 is a cross sectional side elevation view of the substrate shown in FIG. 4 having a liner over the trench;

FIG. 6 is a cross sectional side elevation view of the substrate of FIG. 5 having a barrier/seed layer;

FIG. 8 is a cross sectional side elevation view of the substrate of FIG. 7 having another pillar formed in the trench;

FIG. 9 is a cross sectional side elevation view of the substrate of FIG. 8 having conductive elements formed in the trench and on the handle side of the substrate;

FIG. 10 is a cross sectional side elevation view of the substrate of FIG. 9 as a final structure;

FIG. 11 is a cross sectional side elevation view of a substrate similar to the substrate shown in FIG. 2, having a buried interconnect area, according to an embodiment of the disclosure;

FIG. 12 is a cross sectional side elevation view of a substrate forming a buried interconnect area;

FIG. 13 is a cross sectional side elevation view of the substrate of FIG. 12 having through silicon vias in the substrate;

FIG. 14 is a cross sectional side elevation view of the substrate of FIG. 13 with the substrate flipped over;

FIG. 15 is a cross sectional side elevation view of the substrate of FIG. 14 having thermoelectric pillars formed in the substrate and connected to the buried interconnect area;

FIG. 16 is a cross sectional side elevation view of an integrated circuit package, according to an embodiment of the disclosure, having a substrate similar to the substrate shown in FIGS. 1 and 10 connected to another substrate;

FIG. 17 is a cross sectional side elevation view of the package shown in FIG. 16 having a heat sink; and FIG. 18 is a cross sectional side elevation view of an integrated circuit package according to an embodiment of the present disclosure, including a heat sink on a substrate similar to the package shown in FIG. 17, but without through silicon vias in the substrate, and including an external power/voltage source.

DETAILED DESCRIPTION

Figure 1:
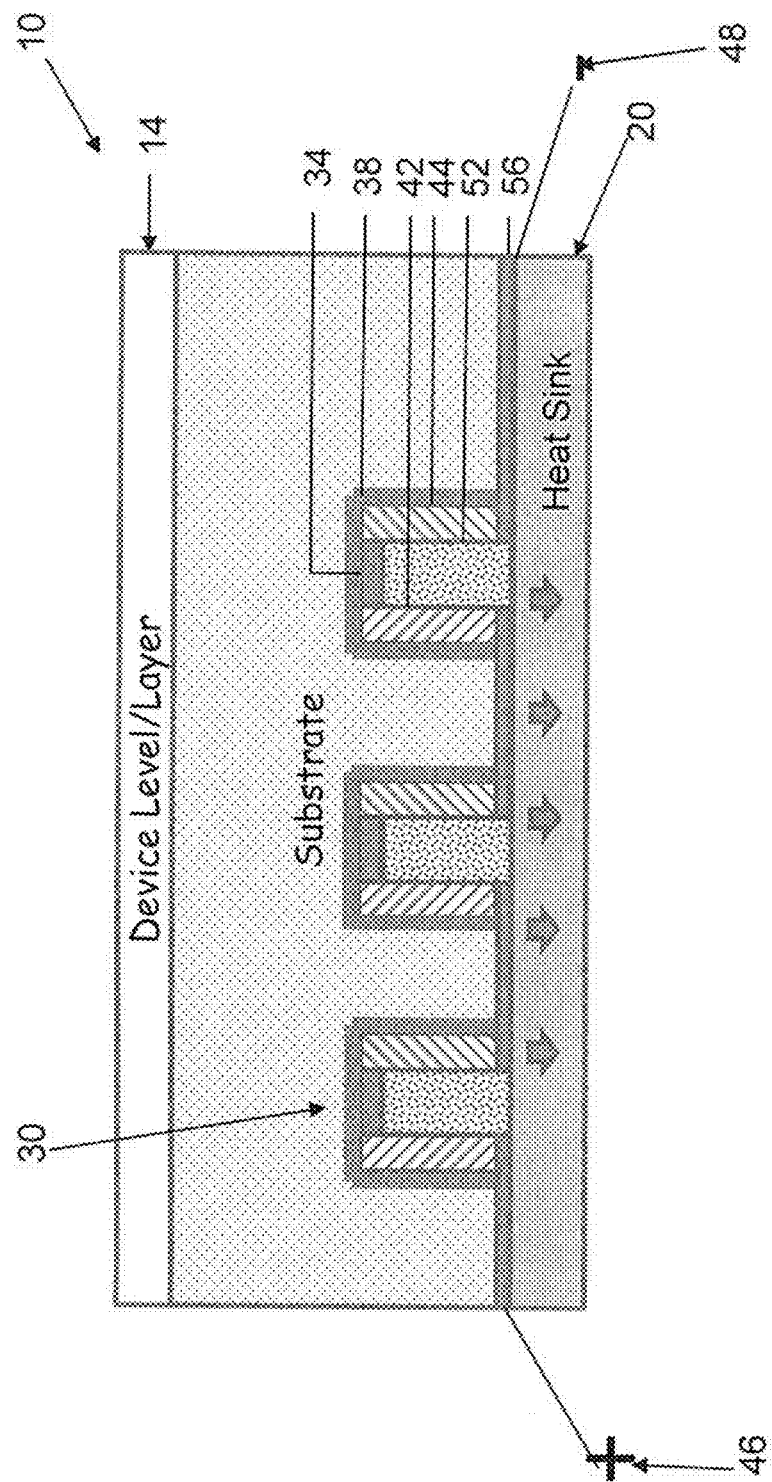
FIG. 1 is a cross sectional side elevation view of a substrate having a device level/layer, the substrate includes a series of thermoelectric couples, and the substrate communicates with a heat sink, according to an embodiment of the disclosure.

Referring to FIG. 1, a semiconductor substrate 10 according to an embodiment of the disclosure is discussed herein. One side of the substrate 10 includes a device layer or level 14 (also referred to as an active device side), and the opposite side of the substrate 10 is coupled to a heat sink 20. Thermoelectric couples 30 each include a trench created from the handle side (the heat sink side) of the substrate 10.

The thermoelectric couples 30 include a cooling conducting plate 34, which, for example, may be comprised of metal, for example, copper, or Tungsten etc., and is embodied as a copper cooling plate in the embodiment of FIG. 1. An isolation layer 38 surrounds the thermoelectric couples 30, that is, the isolation layer extends along a perimeter of the trench. The thermoelectric couples 30 include an N-type thermoelectric material pillar 42 and a P-type thermoelectric material pillar 44 in the trench separated by the conductive contact plate 34 for heat transfer. The N-type and P-type thermoelectric materials can be deposited in the trenches. The N-type and P-type material pillars are comprised of thermoelectric materials, for example, Bismuth Telluride, Lead Telluride and other materials. An area of the trench defined between the N-type thermoelectric pillar 42 and the P-type thermoelectric pillar 44, and over the conducting plate 34 can be optionally filled with a filler 52. A series connection layer 56 electrically connects the thermoelectric couples on the handle side of the substrate, and enables current flow, for example, a positive 46 to a negative 48 current flow. The series connection layer 56 is positioned between the trenches and the heat sink 20, and runs along the length of the substrate to connect the thermoelectric couples on the handle (trench opening) side of the substrate.

The embodiment shown in FIG. 1 of the present disclosure thereby describes an integrated circuit having a cooling technique which includes thermoelectric couples 30 having thermoelectric pillars in trenches extending partially into the substrate 10 and connected in series within the substrate with a direct or buried link. For example, the trench can extend a small depth from the handle side of the substrate. Alternatively, the trench can extend in the substrate until closely reaching the device side or device level in the substrate. Preferably, the trench will not penetrate the device level of the substrate. An example depth of the trench can include a shallow trench that can accommodate the features of the thermoelectric pillars as in the present disclosure, to a trench depth that is close to the active layer or adjacent the active layer.

The plurality of the trenches can be connected in series using a conductive path, the series connection layer 56, formed on the handle side of the device as shown in FIG. 1, and connected to an appropriate voltage source (power source) for active cooling. The thermoelectric couples can communicate with a heat sink on the handle side of the substrate (as shown in FIGS. 16 and 17).

The device layer 14 of the substrate can be connected to the other substrates within an IC package (shown in FIGS. 16 and 17). Connection features, such a ball grid, or connection pads, can be used for electrical connections within an IC package, for example, from the device level in the IC package. The method and structure of the present disclosure, using the thermoelectric couples and electrical current flow, makes use of a thermoelectric effect to transfer heat from the device layer 14 of the substrate to the heat sink 20 communicating with a handle side (opposite side from the device layer) of the substrate.

Figure 2:
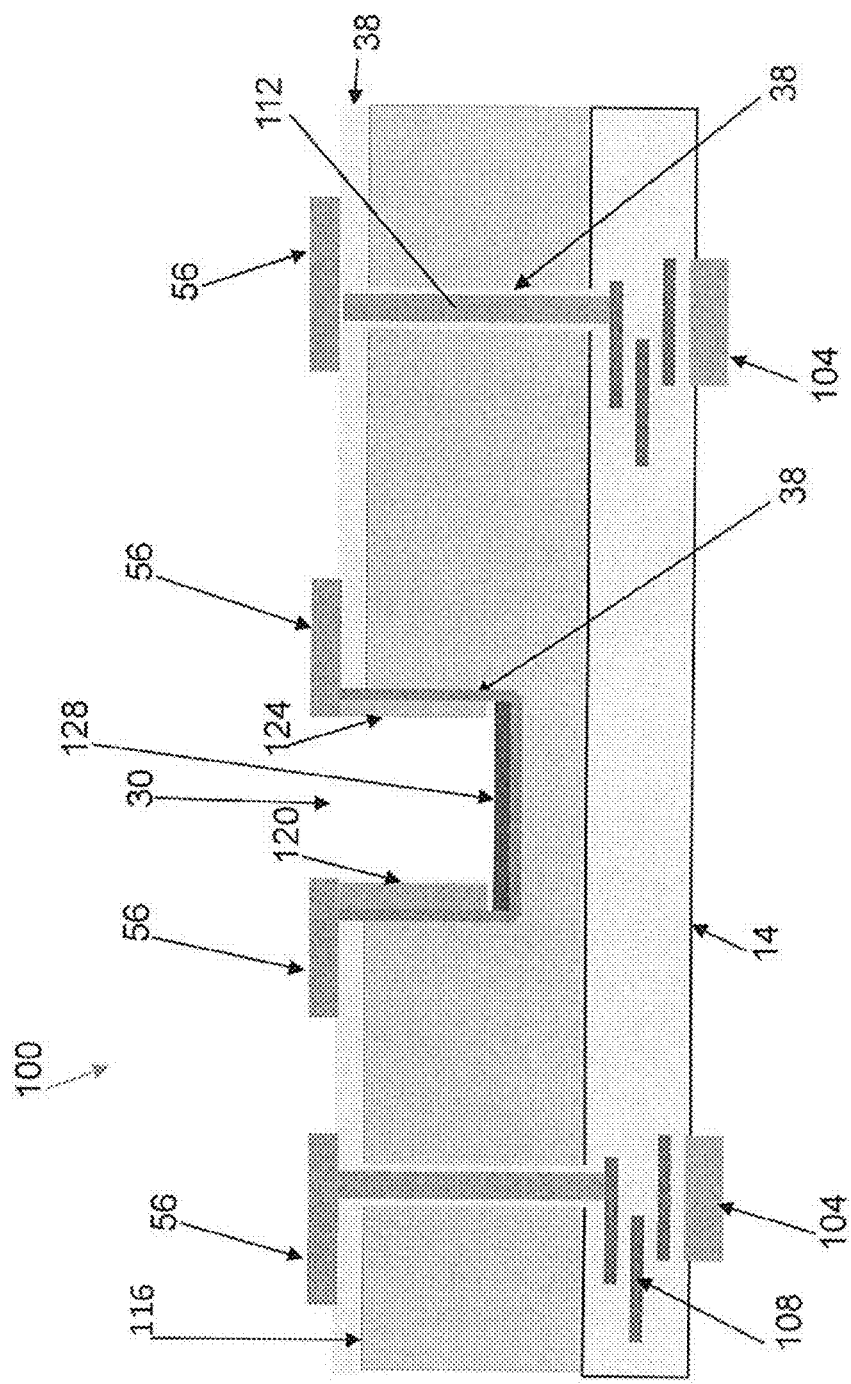
FIG. 2 is a cross sectional side elevation view of a substrate having a device level layer, a trench, and through silicon vias, according to an embodiment of the disclosure.

Referring to FIG. 2, in one embodiment according to the present disclosure, a substrate 100 is similar to the substrate shown in FIG. 1, and similar elements have the same reference numbers. The substrate 100 includes a device level or layer 14. Connection pads 104 are connected to the device layer and communicate with conductive levels 108 in the active layer 14. The connection pads 104 are comprised of an electrically conductive material. Through vias 112 (i.e., through silicon vias (TSVs)) connect the active layer 14 to the connection layer 56 (shown partially in FIG. 2) on a handle side 116 of the substrate 100. The trench 30 includes an isolation layer 38 along the opposing sides of the trench 30, which extends between the handle side 116 of the substrate 100 and the connection layer 56. The isolation layer is also deposited along the side walls of the vias, as shown in FIG. 2.

An N-type thermoelectric pillar 120 material is deposited on one side of the trench 30, and can comprise N-type Bismuth Telluride (Bi2 Te3). A P-type thermoelectric pillar 124 material is deposited on an opposite side of the trench 30 from the N-type pillar in the trench 30. The P-type pillar can comprise P-type Bismuth Telluride (Bi2 Te3). A trench layer 128 is between the N-type and P-type pillar and is positioned at the bottom of the trench 30. The trench layer 128 may be comprised of, for example, copper, or tungsten, which are electrically conducting and thermally conducting.

Referring to FIGS. 3-10, a process flow for manufacturing a semiconductor device, according to an embodiment of the disclosure, is discussed below. Similar elements in the embodiments shown in FIGS. 1 and 2 have the same reference numerals. Referring to FIG. 3, a substrate 200 includes through vias 112 connecting the handle side 116 of the substrate to the active layer 14. An oxide layer 38 is initially present on the backside of the wafer.

Referring to FIG. 4, a trench 210 is etched in the substrate 200. Referring to FIG. 5, a liner 214 is formed along the perimeter of the trench 210 which can be selectively deposited. The liner can be comprised of material which has good thermal conductivity but electrically isolating. Referring to FIG. 6, a barrier/seed layer 218 is deposited over the liner 214 along the handle side of the substrate and along the perimeter of the trench 210. The barrier/seed layer can be comprised of materials, for example, Titanium (Ti), Ruthenium (Ru), or Titanium Nitride (TiN), which also have good thermal conductivity.

Figure 7:
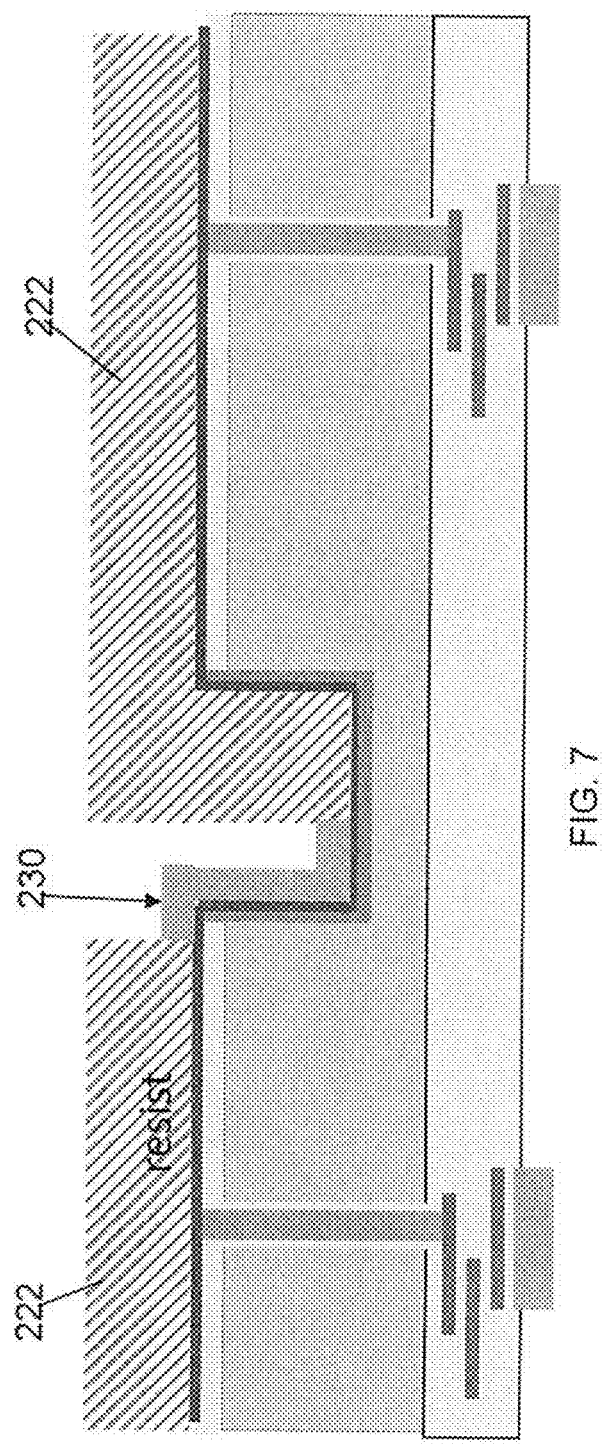
FIG. 7 is a cross sectional side elevation view of the substrate of FIG. 6 having a pillar formed in the trench.

Referring to FIG. 7, a resist layer 222 is deposited over the handle side 116 of the substrate 200. Lithography and reactive ion etching can be used to form a trench in the resist. An n-type pillar 230 is formed on one side of the trench. The n-type pillar can be comprised of a N-type thermoelectric material, e.g., N-type Bismuth Telluride (Bi2 Te3). Referring to FIG. 8, the resist has been removed partly and a P-type pillar 234 is formed on the opposite side of the trench from the N-type pillar. The N-type pillar can be comprised of P-type thermoelectric material, e.g., P-type Bismuth Telluride (Bi2 Te3).

Referring to FIG. 9, a resist layer 222 (as an etch barrier) is deposited to protect the N-type and P-type thermoelectric pillars. The resist layer 222 is etched away to deposit a conductive layer 238 at the areas shown in FIG. 9. The conductive layer 238 can be comprised of, for example, copper, or tungsten, which are electrically conducting to allow passage of current between the thermoelectric pillars. Referring to FIG. 10, the resist 238 and the barrier/seed layer 218 have been partially removed, for example, by etching, and the final substrate 250 with the thermoelectric couple 254 is shown.

FIG. 1 shows multiple trenches that are shown in FIG. 10 (and in FIGS. 16 and 17 below). The present disclosure thereby describes an integrated circuit having a cooling technique which includes thermoelectric couples having thermoelectric pillars extending partially into the substrate and connected in series within the substrate with a direct or buried link. The plurality of the thermoelectric couples (shown in FIG. 1) can be connected in series using a conductive path formed on the handle side of the device as shown in FIG. 1, and connected to an appropriate voltage source for active cooling. The thermoelectric couples and pillars communicate with a heat sink on the handle side of the substrate.

Referring to FIG. 11, another embodiment according to the present disclosure includes a substrate 300 including N-type and P-type thermoelectric pillars 304, 308, respectively. Both thermoelectric pillars can be comprised of any of the known thermoelectric materials (e.g., Bi2 Te3). A buried interconnect area 312 can include implanted metal in the substrate. The buried interconnect area 312 communicates with the pillars 304, 308.

Referring to FIGS. 12-15, a process flow for manufacturing the substrate 300 shown in FIG. 11 is discussed. Referring to FIG. 12, a resist layer 320 is deposited over part of an active side 324 of the substrate except for an area corresponding to an area of the substrate for an implanted conductor 330 to form a buried interconnect 340 (shown in FIG. 15). Referring to FIG. 13, the active level 14 can be formed on the active side 324 of the substrate, and TSVs 112 formed in the substrate 300.

Referring to FIG. 14, the substrate 300 is shown flipped over so that the active level 14 is on the bottom in the drawing. Referring to FIG. 15, pillars 304, 308 are formed from the handle side 116 of the substrate 300, and the substrate 300 is the same as shown in FIG. 11. The substrate 300 includes N-type and P-type pillars 304, 308. The buried interconnect 340 has been formed within the substrate 300 and connects the pillars 304, 308.

The voltage applied to the free ends of two different conducting materials, results in a flow of electricity through a series of thermoelectric couples, and two semiconductors in series. Current flows through the series electrical connection on the handle side (or backside) of the substrate through the N-type thermoelectric pillar to the conducting plate, to the P-type thermoelectric pillar and subsequently to the heat sink. Since the thermoelectric couples are in series (or daisy chained), the current flows though the all the thermoelectric couples connected in series. Peltier cooling causes heat to be absorbed from the vicinity of the conducting cooling plate, and to move the absorbed heat to the other end of the substrate, i.e., to the heat sink. When current is forced through the unit (the substrate as shown in the figures), the electrons at one end absorb energy, while those at the other end release energy. Therefore with a continuous current flow, heat is constantly absorbed at one end and released at another end.

Referring to FIG. 16, an IC package 400, according to an embodiment of the present disclosure, includes similar features to previously presented embodiments which have the same reference numerals. The IC package 400 includes a second substrate 404. The second substrate 404 is connected using solder balls 408 to a substrate 350 incorporating the features of the present disclosure shown in FIG. 10 as the substrate 250. The substrate 350 includes an active side 14 and a handle side 116. The trenches 412 of the substrate 400 are similar to those described above as trench 30, shown in FIGS. 1 and 2, and thermoelectric couple 254 of substrate 250 shown in FIG. 10. In the IC package 400 of FIG. 16, the substrate 350, and its through vias are connected to the second substrate 404 using the solder balls 408 and conductive pads 104. Referring to FIG. 17, the IC package 400 is shown attached to other substrates 460 (using solder balls 408), and a heat sink 470 is positioned over the additional substrates 460 and the substrate 350. The heat sink 470 is connected using a thermal interface material 474 (TIM) which enhances the heat transfer 478 from the substrate 350 and its trenches 412 to the heat sink 470.

Referring to FIG. 18, another embodiment of an IC package 500, according to the present disclosure, has similar features to the package shown in FIGS. 16 and 17 with the same reference numerals for the same features. The IC package 500 includes a substrate 550, and trenches 412 which are shown in FIGS. 16 and 17. TSVs 112 shown in FIGS. 16 and 17, have been eliminated in the substrate 550. Separate wiring (not shown) for current flow through the substrate and pillars in the trenches can be utilized.

A heat sink 504 is posited over the trenches 412 of the substrate 550. The heat sink 504 is similar in structure and function to the heat sink 470 shown in FIG. 17, however, the heat sink 504 has a series of fins 508 for enhancing heat dissipation. The substrate 550 and trenches receive power from an electrical circuit 512 through the handle side of the substrate without using TSVs. The substrate 550 is connected to a second substrate 404 as shown in FIG. 18.

Generally, according to the embodiments of the present disclosure, a semiconductor device package and method for manufacturing the same includes embedded thermoelectric couples in a semiconductor substrate. The thermoelectric couples can include trenches extending partially into the substrate with N-type and P-type pillars extending into the trenches. A thermally conducting isolation layer can be deposited in the trenches. The isolation liner can be comprised of a material which has a high thermal conductivity but is electrically isolating. The thermoelectric N-type and P-type pillars are electrically connected using a contact plate or conducting plate to form each of the partially embedded thermoelectric couples. A series connection layer electrically connects the plurality of thermoelectric couples on the handle side of the substrate. A power source provides electrical current to the series connection layer formed, and provides current flowing through the plurality of the series thermoelectric couples. A heat sink is positioned adjacent to the connected thermoelectric couples and transfers heat away from the device side of the substrate.

The embodiments of the present disclosure do not require moving components or cooling apparatus, such as liquid pumping which can be used to cool three dimensional ICs. The trenches increase surface area contact with the substrate to enhance heat transfer to the heat sink device to increase cooling of the IC package. The thermoelectric pillars do not use the area of the substrate for the device level (or device layer) side of the substrate, thus allowing the most efficient use of the device level.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:
1. A semiconductor device package, which comprises:
   a plurality of thermoelectric couples embedded in a semiconductor substrate of a semiconductor device, the thermoelectric couples each including thermoelectric pillars positioned opposite one another and extending into the substrate from a handle side of the substrate being opposite from a device side of the substrate;

the pillars extending partially into the substrate from the handle side of the substrate, the opposing pillars being N type and P type, respectively;

a thermally conducting isolation layer along a perimeter of the trenches and along outer sides of the pillars;

a conductive plate electrically connecting the n type and p type pillars;

a series connection layer electrically connecting the plurality of thermoelectric couples on the handle side of the substrate for receiving a voltage via the series connection layer, the thermally conducting isolation layer contacting the series connection layer; and a heat sink positioned adjacent to the thermoelectric couples for transferring heat away from the device side of the substrate to the heat sink using the thermoelectric couples.

2. The device of claim 1, further comprising:
a power source for providing electrical current to the series connection layer such that the electrical current flows through the plurality of thermoelectric couples.

3. The device of claim 1, wherein the power source is electrically connected to the series connection layer via through silicon vias.

4. The device of claim 1, wherein the power source includes a voltage source connected to the series connection layer, without the use of through silicon vias.

5. The device of claim 1, wherein the conductive plate separates the n-type and the p-type pillars defining a bottom of each of the trenches opposite the openings of the trenches in the handle side of the substrate.

6. The device of claim 1, wherein the opposing pillars of the thermoelectric couples are positioned in each of a plurality of trenches in the substrate, each of the trenches define an opening in a handle side of the substrate.

7. The device of claim 1, further comprising;
a filler material deposited in each of the trenches between the n-type and p-type pillars.

8. The device of claim 1, wherein the heat sink is a finned copper heat sink.

9. The device of claim 1, wherein the series connection layer is positioned between the thermoelectric couples and the heat sink.

10. The device of claim 1, further comprising:
a power source for providing electrical current to the series connection layer, such that the electrical current flows through the plurality of thermoelectric couples from each of the p-type pillars through the conducting plate to the n-type pillars, respectively, and through the series of thermoelectric couples.

* * * * *